United States Patent
Tiwari

[11] Patent Number: 6,101,117
[45] Date of Patent: Aug. 8, 2000

[54] TWO TRANSISTOR SINGLE CAPACITOR FERROELECTRIC MEMORY

[75] Inventor: Sandip Tiwari, Ossining, N.Y.

[73] Assignee: International Business Machines Corporation, Armonk, N.Y.

[21] Appl. No.: 09/273,795

[22] Filed: Mar. 22, 1999

[51] Int. Cl.[7] .................................................. G11C 11/22
[52] U.S. Cl. ............................................. 365/145; 365/65
[58] Field of Search .................................. 365/145, 149, 365/63, 65

[56] References Cited

U.S. PATENT DOCUMENTS 5,396,452   3/1995   Wahlstrom ................................ 365/149
5,656,528   8/1997   Wahlstrom ................................ 438/152
5,737,261   4/1998   Taira ........................................ 365/145

*Primary Examiner*—Richard Elms
*Assistant Examiner*—Anh Phung
*Attorney, Agent, or Firm*—Perman & Green, LLP; Manny W. Schecter

[57] ABSTRACT

A back-plane ferroelectric memory apparatus employing a read transistor, a write transistor and a ferroelectric capacitor storage means. A back plane forms a gate region underneath the read transistor with the potential of the back plane affected by polarization of the ferroelectric capacitor. The write and read transistors are different, the write transistor may be a vertical structure and the read transistor may be a write transistor and the write transistor's drain is connected to the back plane of read transistor and a plate of the ferroelectric capacitor.

15 Claims, 6 Drawing Sheets

TWO TRANSISTOR SINGLE CAPACITOR FERROELECTRIC MEMORY

BACKGROUND OF THE INVENTION:

1. Field of the Invention

The present invention relates to ferroelectric memory structures and more particularly to ferroelectric memory apparatus using transistor switches and ferroelectric capacitors as the storage elements.

2. Background Art

Attempts to incorporate ferroelectric technology into memory structures has been tried for more than thirty years. Ferroelectric memories usually take the form of a series connection of single transistor and a stack capacitor. The transistor is used to write as well as read the capacitor. The use of ferroelectric technology in memory structures that utilize a transistor as the switch and a ferroelectric capacitor as the storage medium usually suffer from read disturb problems. This occurs because reading normally requires a process in which stored bits can be flipped or, at least, disturbed from their state. Having to rewrite the disturbed bit is a severe penalty that is one of the reasons that continues to prevent adoption of ferroelectric technology in memories even though they offer the potential of high density, non-volatility and high speed.

SUMMARY OF THE INVENTION

The present invention provides a floating gate memory structure compatible with advanced devices that utilize a buried floating gate. The floating gate, consisting of either a semiconductor or a metal, is buried under a thin transistor channel. Charge on the floating gate determines the threshold voltage of the device and the transistor's conduction, that can be read through a bias voltage at source, drain and the gate, describes the stored state of the device. By decoupling the oxide thickness of a floating gate from the scaling of the transistor, a device is achieved that can be scaled to significantly smaller dimension than the present-day memory structures.

An object of the present invention is to provide a ferroelectric memory apparatus that uses a back-plane structure.

Another object of the present invention is to provide a back-plane ferroelectric memory apparatus employing two transistors and a ferroelectric capacitor storage means.

A further object of the present invention is to provide a ferroelectric memory apparatus wherein a back plane forms a gate region underneath a read transistor with the potential of the back plane affected by polarization of a ferroelectric capacitor.

Still another object of the present invention is to provide a ferroelectric memory where the write and read transistors are different.

Another object of the present invention is to provide a ferroelectric memory where a mode of the write transistor is connected to the back plane of read transistor and a plate of the ferroelectric capacitor.

A still further object of the present invention is to provide a ferroelectric memory where the back plane is silicon, or material of higher electron affinity such as W, WN, TiN, and other high temperature silicon-compatible non-reactive material.

Another object of the present invention is to provide a ferroelectric memory where back plane regions are random access NAND or NOR cells.

Still another object of the present invention is to provide a ferroelectric memory where the write transistor is a vertical structure and the read transistor is a back plane planar structure.

Other and further features, advantages and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

The above set forth and other features of the invention are made more apparent in the ensuing Detailed Description of the Invention when read in conjunction with the attached Drawings, wherein.

BRIEF DESCRIPTION OF THE INVENTION

Figure 1:
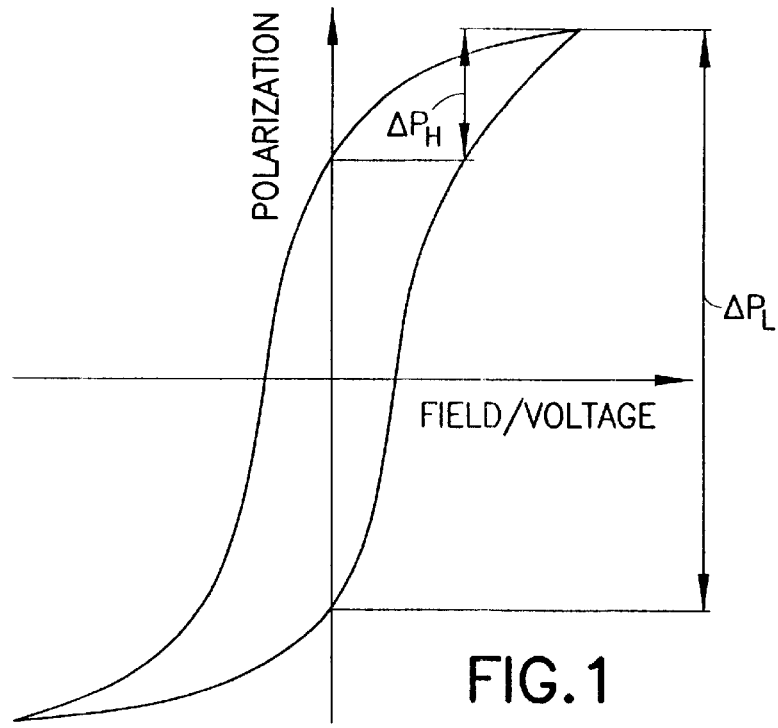
FIG. 1 is an illustration of a hysteresis loop for a ferroelectric capacitor.

The process of reading a ferroelectric capacitor in a memory can cause it to become disturbed. Consider the hysteresis loop shown in FIG. 1. Reading implies checking the capacitor to determine if the amount of polarization charge is small or large. Usually, this is accomplished by applying a voltage to the capacitor and checking the amount of charge on the bit line. A small charge $\Delta$ implies one state ($\Delta P_H$ in FIG. 1) and a large charge $\Delta$ implies the other state ($\Delta P_L$ in FIG. 1.). However, this process of checking the amount of charge places the capacitor in the same state requiring rewriting of the original state of the cell if non-volatile storage has to be maintained.

Figure 2:
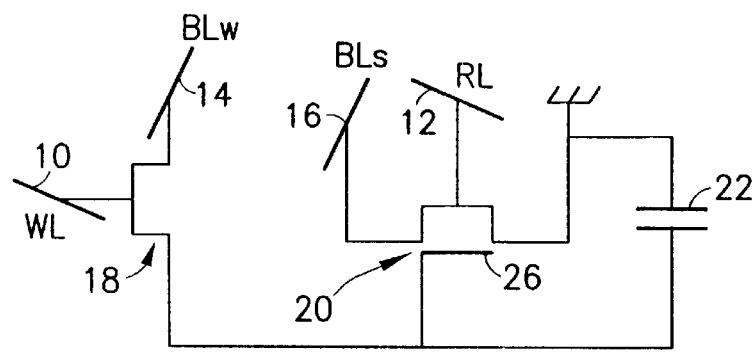
FIG. 2 is a schematic circuit for a general embodiment of two-transistor, single capacitor arrangement that uses a back plane gate transistor for efficient and non-disturb reading of the ferroelectric capacitor using separate write and sense bit lines.
Figure 3:
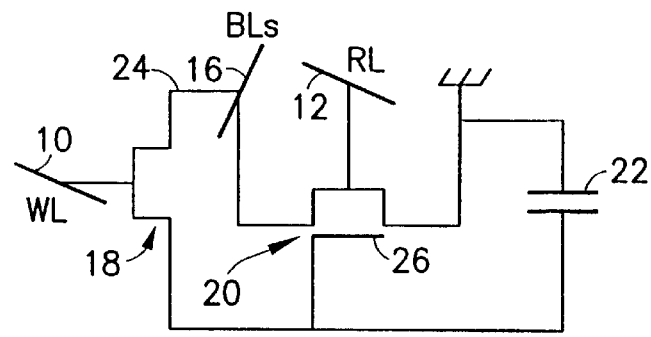
FIG. 3 is a schematic circuit that shows a specific compact form embodiment of the circuit of FIG. 2 with a common bit line.

FIGS. 2 and 3 show circuit schematics of embodiments of the memory structure, in FIG. 2, including the write line 10, the read line 12, the write bit line 14, the sense bit line 16, write transistor 18, read transistor 20 and the capacitor 22. FIG. 3 illustrates a similar structure, however a single bit line 24 is connected to both transistor 18 and transistor 20. In FIGS. 2 and 3 the transistor 20 includes a back-gate plane 26 connected to transistor 18 and capacitor 22.

Figure 4:
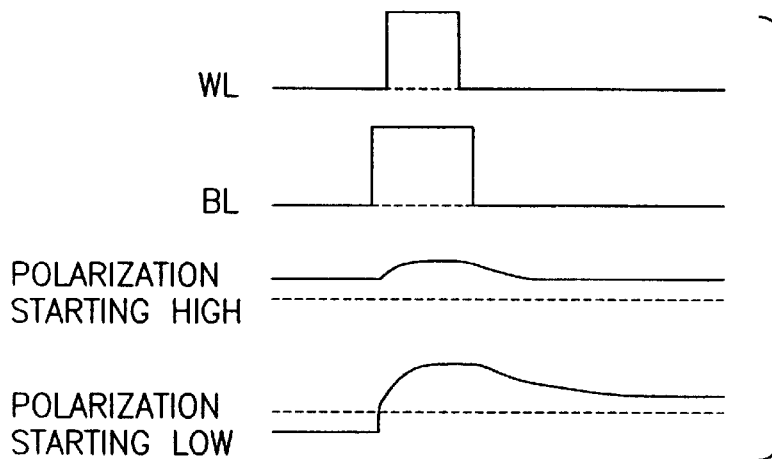
FIG. 4 is an illustration of waveforms that show an example of the writing of a high state on the ferroelectric capacitor.
Figure 5:
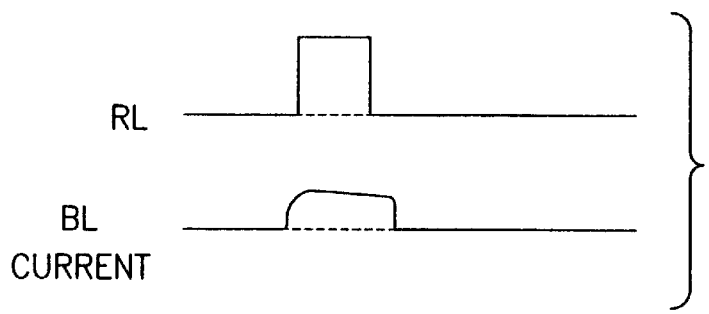
FIG. 5 is an illustration of waveforms that show reading of a high state by application of a sense signal which allows a current to flow on the bit line.
Figure 6:
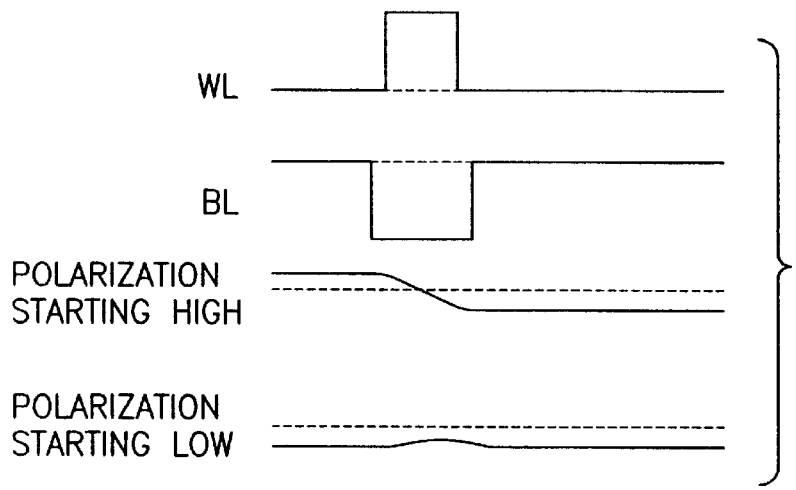
FIGS. 6 an 7 are illustrations of waveforms that show the low state cycle of writing and sensing of the structure.
Figure 7:
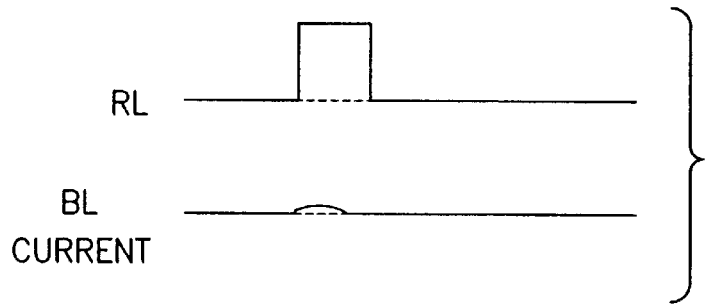

FIG. 4 shows an example of the signals associated with the writing of a high state on the ferroelectric capacitor 22 including the write line signal, the bit line signal, the polarization of the capacitor. FIG. 5 shows reading of the curves associated with this high state by application of a read (sense) signal which allows a current to flow on the bit line. The voltages are small so that their coupling to the underlying back-plane is small. FIGS. 6 and 7 show curves indicating the low state cycle of writing and sensing of the structure.

The present invention describes a two-transistor (device 18 for writing and device 20 for reading/sensing) and one capacitor 22 structure that provides for a disturb-immune read operation through use of a novel back plane 26 on the read/sense transistor 20.

A transistor with a back plane such as transistor 20 is a device that is very sensitive tool to changes taking place on the back plane 26. One example of such change is any variation of potential of the back plane 26. This potential variation on back plane 26 directly influences in turn the threshold voltage of the device 20 and hence any current that flows through the device 20. No particle conduction occurs between the back plane 26 and the transistor 20 during this step and hence the backplane transistor 20 is a strongly capacitive probe of the back plane 26 with the output signal being the current or state of conduction of the transistor 20 employing the back plane 26. The polarization of a ferroelectric capacitor can, for example, be tested by this approach by connecting its plate to the back plane without affecting its state.

Figure 8:
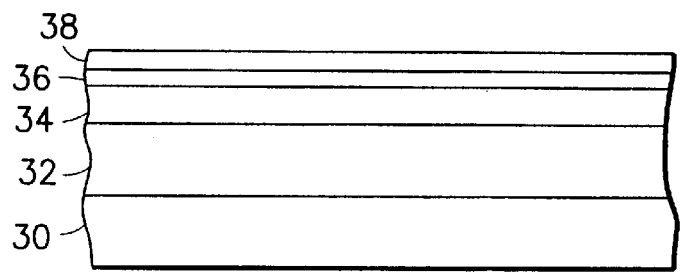
FIGS. 8, 9, 10, 11, 12, 13, 14 and 15 are cross-section illustrations of various stages in the fabrication of an embodiment of a two-transistor, single ferroelectric capacitor memory structure according to the principles of the present invention.
Figure 9:
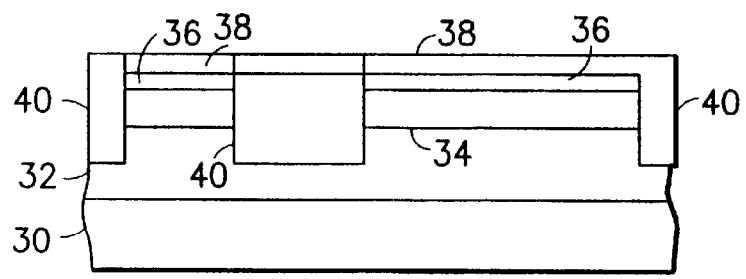
Figure 10:
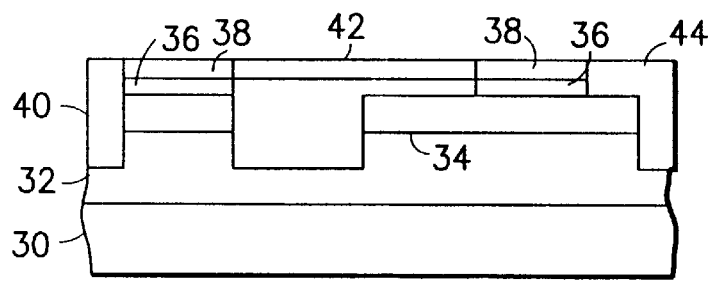
Figure 11:
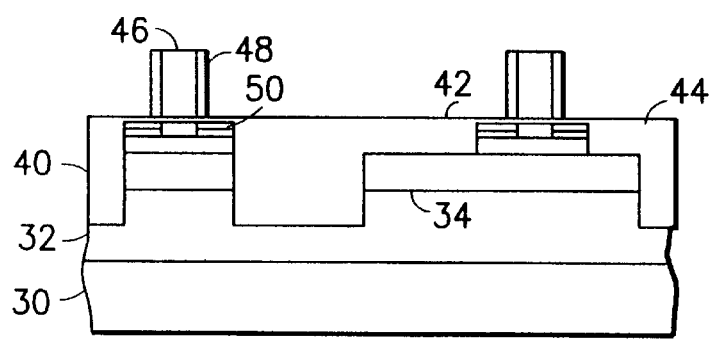
Figure 12:
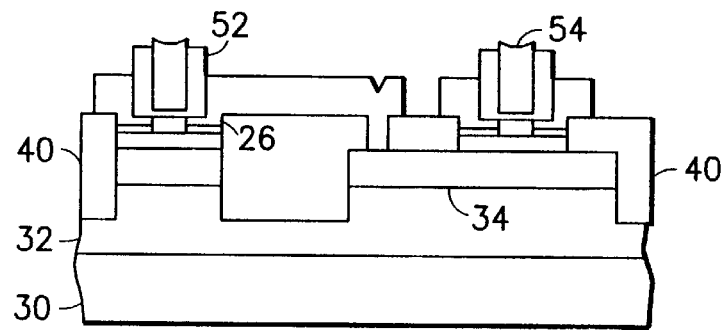
Figure 13:
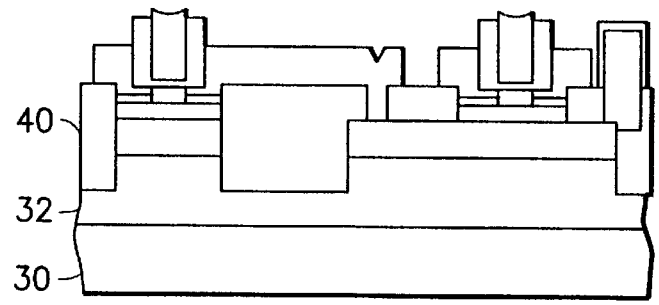
Figure 14:
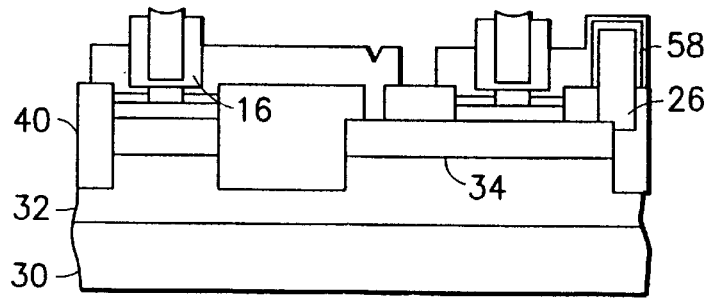
Figure 15:
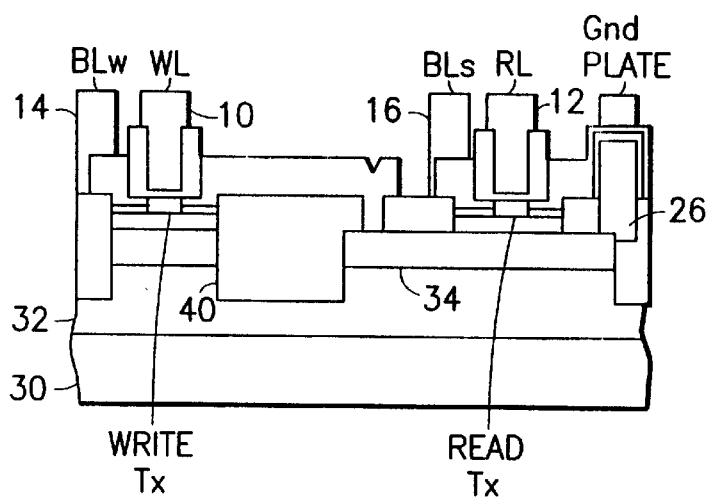

The fabrication steps for the preferred embodiment of the invention of FIG. 3 are shown in FIGS. 8, 9, 10, 11, 12, 13, 14, and 15. In the step of FIG. 8, the substrate 30 has a buried oxide layer 32 formed thereon. A back plane layer 34, a back oxide 36 and a silicon layer 38 are also formed. The two transistors to be fabricated may use the same doping in the channel or can use different dopings (this affects threshold voltage which itself is modulated by the capacitor polarization for the read transistor). The silicon layer 38 is masked and patterned to form the two transistors, and the portions of the silicon 38 used for the source, drain and the channel region of the device are doped and separated by oxide insulation regions 40 as shown in FIG. 9. Second control oxides 42 and 44 are grown on the substrate as shown in FIG. 10. FIG. 11 shows the transistors formed by growth of control oxide deposition of gate material, patterning and doping following side-wall oxidation. The gate material can be poly-silicon or a nonreactive metal. The gate is patterned as shown in FIG. 11. A thin side wall oxide 48 is grown and the doped link region 50 is formed by ion-implantation and annealing or other equivalent techniques. As shown in FIG. 12, a thicker oxide or other dielectric is deposited and etched to form a side wall, and a heavier doping is achieved by implantation and annealing, or epitaxy which forms raised source and drain regions. Silicidation following removal of the residual oxide on the source, gate, and the drain region forms the contacts 54. The underlying back planes 34 of one of the transistors is connected to the source 16 and one of the plates 26 for formation of the ferroelectric capacitor as shown in FIG. 14. The bottom electrode 26 of the capacitor is formed next. The ferroelectric 58 is deposited and the top electrode formed. Electrodes such as Pt, Ti Al, $RuO_2$ or $IrO_2$, etc. can be used and the structure interconnected with the rest of circuitry to provide the device shown in FIG. 15 where the elements of the device are given reference numbers corresponding to the elements of FIG. 2.

In the embodiment of the invention shown in FIG. 2 the bit line is kept separate. In the embodiment of FIG. 3, the bit line is common as shown in FIG. 3. FIGS. 16, 17, 18, 19, 20, 21, 22 and 23 illustrate the steps in the fabrication process for forming the structure of FIG. 3.

Figure 16:
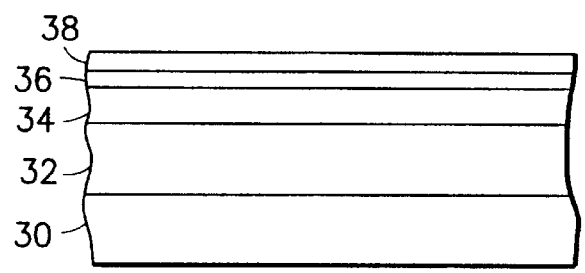
FIGS. 16, 17, 18, 19, 20, 21, 22 and 23 are cross-section illustrations of various stages in the fabrication of an embodiment of a two-transistor single ferroelectric capacitor memory structure with a common bit line according to the principles of the present invention.

In FIG. 16 the same substrate 30, buried oxide 32 back plane layer, back oxide 36 and silicon layer 38 structure is shown as illustrated in FIG. 8.

Figure 17:
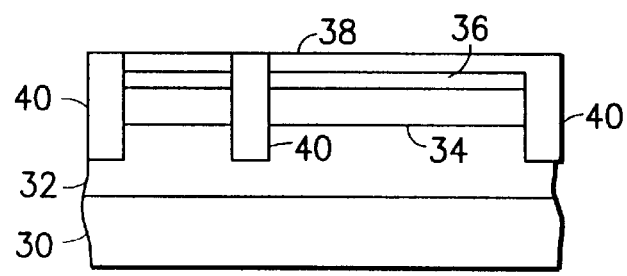
Figure 18:
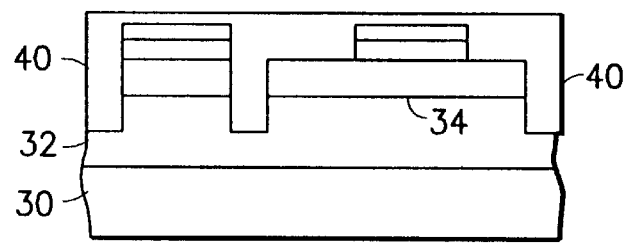
Figure 19:
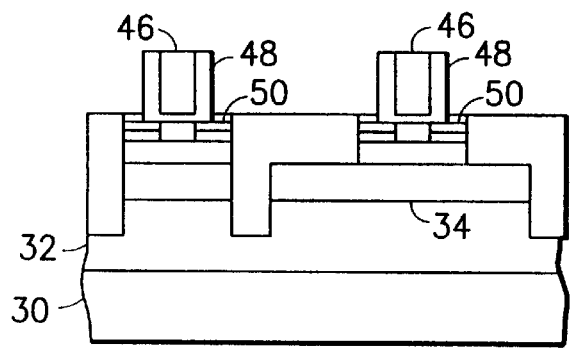
Figure 20:
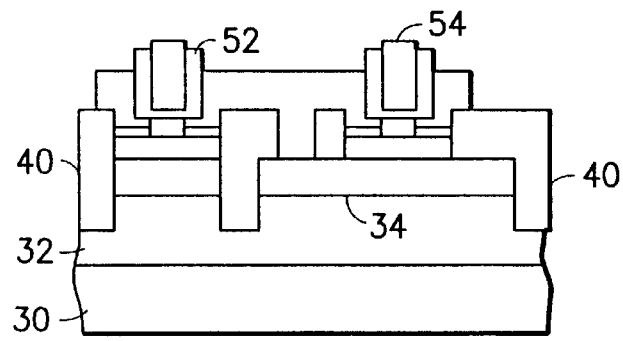
Figure 21:
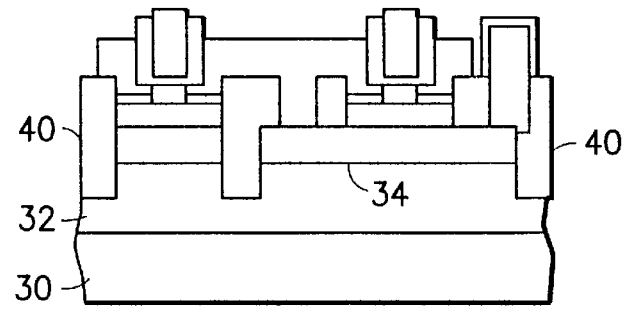
Figure 22:
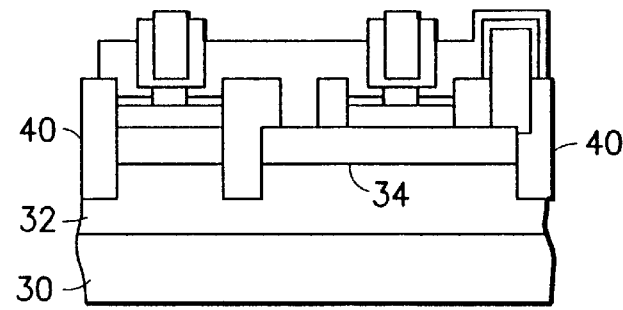
Figure 23:
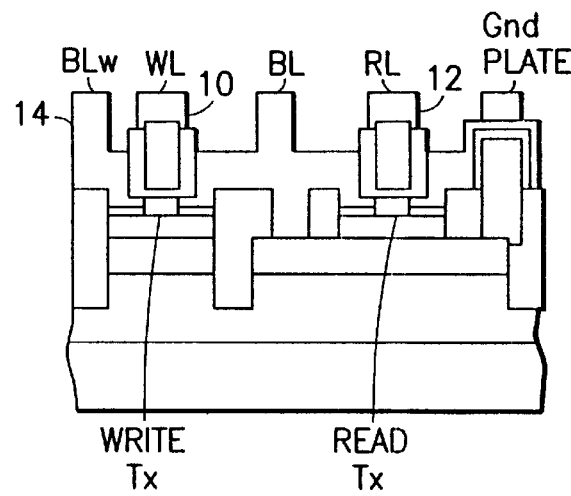

In FIGS. 17 and 18 first and second regions are formed that differ from those of FIGS. 9 and 10.

What has been described are embodiment of ferroelectric memories where a back plane forms a gate region underneath a read transistor with the potential of the back plane affected by polarization of a ferroelectric capacitor.

A back plane transistor is used to sense the charge on a memory capacitor (e.g. ferroelectric). In an indirect manner, thereby preventing undesirable disturbance of the capacitor's charge. In the described memories the write and read transistors are different and the write transistor's drain is connected to the back plane of read transistor and a plate of the ferroelectric capacitor.

The back plane may be silicon or materials such as W, WN, TiN, and other high temperature silicon compatible nonreactive materials. The ferroelectric memories using the back plane regions may be designed as random access NAND or NOR cells and the write transistor may be vertical structure and the read transistor may be a back plane planar structure.

While the invention has been particularly shown and described with respect to preferred embodiments thereof, it will be understood by those skilled in the art that changes in form and details may be made therein without departing from the scope and spirit of the invention.

What is claimed is:

1. A ferroelectric memory employing transistor switches and a ferroelectric capacitor comprising:

a ferroelectric capacitor having first and second plates;

a write transistor device having a first node connected to a first bit line;

a second node connected to said first plate of said ferroelectric capacitor;

a read transistor device having a first node connected to a second bit line, a second node connected to said second plate of said ferroelectric capacitor, and a back plane connected to said second node of said write transistor device and to said first plate of said ferroelectric capacitor.

2. A ferroelectric memory according to claim 1 wherein said first and second bit lines are the same and said write transistor device and said read transistor device have their first nodes connected to the same bit line.

3. A ferroelectric memory according to claim 1 wherein said first bit line connected to said first node of said write transistor device is a write bit line and wherein said second bit line connected to said first node of said read transistor device is a sense bit line.

4. A ferroelectric memory according to claim 1 wherein said write transistor device further includes a gate electrode connected to a write line and said read transistor device further includes a gate electrode connected to a read line.

5. A ferroelectric memory according to claim 4 wherein said read line and write line are separate.

6. A ferroelectric memory according to claim 1 wherein said back plane of said read transistor device forms a gate region responsive to polarization of said ferroelectric capacitor.

7. A ferroelectric memory according to claim 1 wherein said write transistor device is a vertical structure and said read transistor device is a back plane planar structure.

8. A ferroelectric memory according to claim 7 wherein said back plane planar structure uses a polysilicon back plane.

9. A ferroelectric memory according to claim 7 wherein said back plane planar structure uses a single crystal back plane.

10. A ferroelectric memory according to claim 7 wherein said back plane transistor employs a W, Ti, N, WN back plane.

11. A ferroelectric memory according to claim 7 wherein said back plane transistor employs a refractory, high temperature and silicon and silicon dioxide compatible back plane.

12. A ferroelectric memory according to claim 7 wherein said transistors employ MM-single crystal material.

13. A ferroelectric memory according to claim 7 wherein said transistors employ a semiconductor material including $GaA_3$, $GaImA_3$, ImP, SiC, Ge, SiGe.

14. A ferroelectric memory according to claim 1 wherein said ferroelectric memory with said back plane functions as a random access NAND cell.

15. A ferroelectric memory according to claim 1 wherein said ferroelectric memory with said back plane functions as a random access NOR cell.

* * * * *